United States Patent
Lin et al.

(10) Patent No.: US 12,286,511 B2
(45) Date of Patent: *Apr. 29, 2025

(54) LOSS-DISSIPATION FLEXIBLE COPPER CLAD LAMINATE, MANUFACTURING METHOD THEREOF, AND ELECTRONIC DEVICE

(71) Applicant: CPC Corporation, Taiwan, Kaohsiung (TW)

(72) Inventors: Ching-Hsuan Lin, Taichung (TW); Wan-Ling Hsiao, Changhua County (TW)

(73) Assignee: CPC Corporation, Taiwan, Kaohsiung (TW)

( * ) Notice: Subject to any disclaimer, the term of this patent is extended or adjusted under 35 U.S.C. 154(b) by 330 days.

This patent is subject to a terminal disclaimer.

(21) Appl. No.: 17/456,565

(22) Filed: Nov. 24, 2021

(65) Prior Publication Data

US 2022/0169792 A1 Jun. 2, 2022

(30) Foreign Application Priority Data

Nov. 27, 2020 (TW) .................. 109141890

(51) Int. Cl.
| | |
|---|---|
| *C08G 73/10* | (2006.01) |
| *B32B 15/08* | (2006.01) |
| *B32B 15/20* | (2006.01) |
| *B32B 27/28* | (2006.01) |
| *C08G 73/16* | (2006.01) |

(Continued)

(52) U.S. Cl.
CPC .......... *C08G 73/1071* (2013.01); *B32B 15/08* (2013.01); *B32B 15/20* (2013.01); *B32B 27/281* (2013.01); *C08G 73/1042* (2013.01); *C08G 73/16* (2013.01); *C09D 179/08* (2013.01); *H05K 1/0346* (2013.01); *B32B 2307/204* (2013.01);

(Continued)

(58) Field of Classification Search
CPC ....................... C08G 73/1071; C08G 73/1042; C08G 73/16; C08G 73/1032; C08G 179/08; B32B 15/08; B32B 15/20; B32B 27/281; B32B 2307/204; B32B 2457/08; C09D 179/08; H05K 1/0346; H05K 2201/0154; H05K 2201/0355; H05K 3/022; H05K 1/09; H05K 1/0298; H05K 1/0393; H05K 2201/0358; H05K 2203/0759

See application file for complete search history.

(56) References Cited

U.S. PATENT DOCUMENTS

| | | | | |
|---|---|---|---|---|
| 5,932,345 | A * | 8/1999 | Furutani | ................ C08G 73/16 428/209 |
| 2007/0166535 | A1* | 7/2007 | Lu | ........................... B32B 27/08 428/458 |

(Continued)

FOREIGN PATENT DOCUMENTS

| | | | |
|---|---|---|---|
| JP | 2004209680 A | * | 7/2004 |
| JP | 2007090770 A | * | 4/2007 |
| WO | WO-2021125308 A1 | * | 6/2021 |

*Primary Examiner* — John D Freeman
(74) *Attorney, Agent, or Firm* — CKC & Partners Co., LLC

(57) ABSTRACT

The present disclosure provides a low-dissipation flexible copper clad laminate, which includes a copper foil and a polyimide film. The polyimide film is attached to the copper foil. The polyimide film includes a polyimide, and the polyimide has a structure represented by formula (I). Formula (I) is defined as in the specification.

10 Claims, 5 Drawing Sheets

(51) Int. Cl.
  *C09D 179/08* (2006.01)
  *H05K 1/03* (2006.01)
  *H05K 1/09* (2006.01)
(52) U.S. Cl.
  CPC .. *B32B 2457/08* (2013.01); *H05K 2201/0154* (2013.01); *H05K 2201/0355* (2013.01)

(56) References Cited

U.S. PATENT DOCUMENTS

2020/0396833 A1* 12/2020 Johnson ................. B32B 15/08
2022/0056213 A1* 2/2022 Lin ...................... H05K 1/0346

* cited by examiner

LOSS-DISSIPATION FLEXIBLE COPPER CLAD LAMINATE, MANUFACTURING METHOD THEREOF, AND ELECTRONIC DEVICE

RELATED APPLICATIONS

This application claims priority to Taiwan Application Serial Number 109141890, filed Nov. 27, 2020, which is herein incorporated by reference.

BACKGROUND

Technical Field

The present disclosure relates to a flexible copper clad laminate, a manufacturing method thereof and an electronic device. More particularly, the present disclosure relates to a low-dissipation flexible copper clad laminate, a manufacturing method thereof and an electronic device.

Description of Related Art

Since 2015, the International Telecommunication Union (ITU) is officially announced the vision of 5$^{th}$ Generation Mobile Network, all relevant units have successively developed the new technologies and materials. Furthermore, for the new generation of communication networks, it must be achieved the expectances, such as the high transmission rate, the high stability, the low latency and the low transmission loss, at the high frequencies.

The printed circuit board (PCB) is mainly used in the electronic products, such as communications, automobiles and semiconductors, to fix the integrated circuit (IC) and other electronic components, and use the copper wire to connect, so that the electronic signals can be transmitted between different components. According to the known literature, the signal transmission rate ($V_p$) is inversely proportional to the square root of the dielectric constant ($D_k$), as shown in equation (1); and the signal transmission loss (L) is proportional to the dissipation factor ($D_f$) and the square root of the dielectric constant ($D_k$), as shown in equation (2). Therefore, if it is to become a new generation of the high-frequency communication substrate, the materials thereof must have the excellent thermal properties, electrical properties, high chemical resistance and low humidity. In order to achieve the high transmission rate and the low transmission loss, reducing the dielectric constant ($D_k$) and the dissipation factor ($D_f$) of the materials are the goals of development.

$$V_p = C/\sqrt{D_k}, \quad \text{equation (1)}$$

$$L = K \times \left(\frac{f}{C}\right) \times D_f \times \sqrt{D_k}. \quad \text{equation (2)}$$

The common printed circuit board includes the flexible printed circuit board, which is generally formed by attached the polyimide and the copper foil, and the electrical property is closely related to the polyimide. The most common polyimide on the market is Kapton of DuPont, and its dissipation factor is about 0.016. Therefore, the conventional polyimide has no longer satisfied the requirements of the high-frequency signal transmission and the high-speed operation of the circuit board.

Therefore, how to synthesize a polyimide with low dissipation factor, and the prepared flexible copper clad laminate can be applied in the manufacture of the high-frequency transmission printed circuit board, which is the goal of the relevant industry.

SUMMARY

According to one aspect of the present disclosure, a low-dissipation flexible copper clad laminate is provided. The low-dissipation flexible copper clad laminate includes a copper foil and a polyimide film. The polyimide film is attached to the copper foil, wherein the polyimide film includes a polyimide, and the polyimide has a structure represented by formula (I):

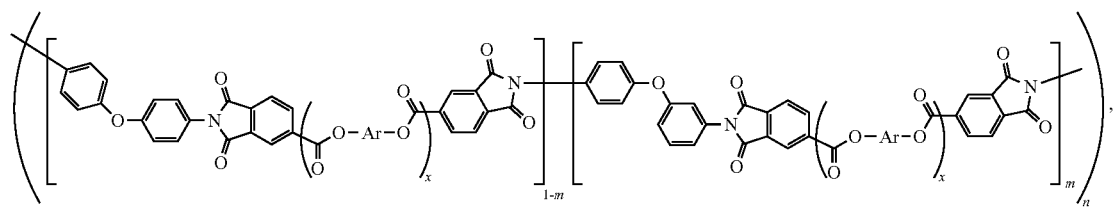

formula (I)

wherein Ar is a divalent organic group containing an aromatic ring, x is 0 or 1, n is an average value, and 30≤n≤500, 0≤m≤1.

According to another aspect of the present disclosure, a manufacturing method for a low-dissipation flexible copper clad laminate according to the aforementioned aspect includes steps as follows. A mixing step is performed, wherein a diamine monomer represented by formula (i) and a diamine monomer represented by formula (ii) are dissolved in an organic solvent, and then a dianhydride monomer represented by formula (iii) is added to form a polyamic acid solution:

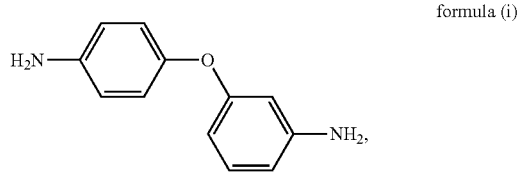

formula (i)

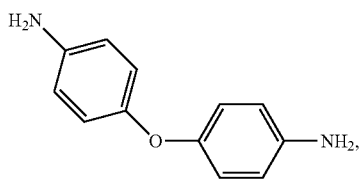

formula (ii)

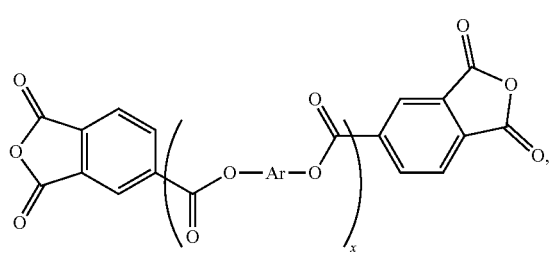

formula (iii)

wherein Ar is the divalent organic group containing the aromatic ring, x is 0 or 1. A condensation reaction is performed, wherein the polyamic acid solution is coated on the copper foil, and performed the heat and ring-closing to obtain the low-dissipation flexible copper clad laminate.

According to further another aspect of the present disclosure, an electronic device is provided. The electronic device includes the low-dissipation flexible copper clad laminate according to the aforementioned aspect.

BRIEF DESCRIPTION OF THE DRAWINGS

The present disclosure can be more fully understood by reading the following detailed description of the embodiment, with reference made to the accompanying drawings as follows.

DETAILED DESCRIPTION

The present disclosure will be further exemplified by the following specific embodiments. However, the embodiments can be applied to various inventive concepts and can be embodied in various specific ranges. The specific embodiments are only for the purposes of description, and are not limited to these practical details thereof.

In the present disclosure, the compound structure can be represented by a skeleton formula, and the representation can omit the carbon atom, the hydrogen atom and the carbon-hydrogen bond. In the case that the functional group is depicted clearly in the structural formula, the depicted one is preferred.

In the present disclosure, in order to concise and smooth, "polyimide has a structure represented by formula (I)" can be represented as a polyimide represented by formula (I) or a polyimide (I) in some cases, and the other compounds or groups can be represented in the same manner.

Polyimide

A polyimide is provided of the present disclosure, which has a structure represented by formula (I):

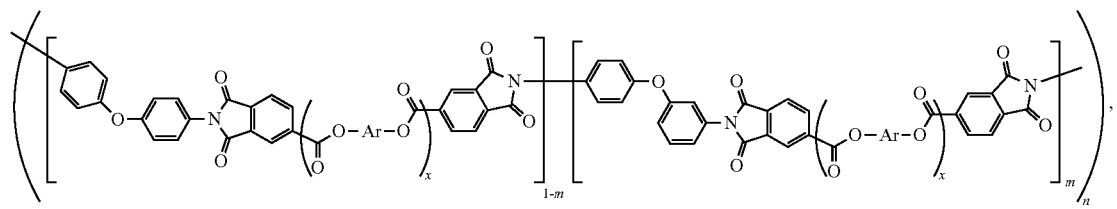

formula (I)

wherein Ar is a divalent organic group containing an aromatic ring, x is 0 or 1, n is an average value, and 30≤n≤500, 0≤m≤1. Specifically, Ar can be a structure represented by formula (A), formula (B) or formula (C):

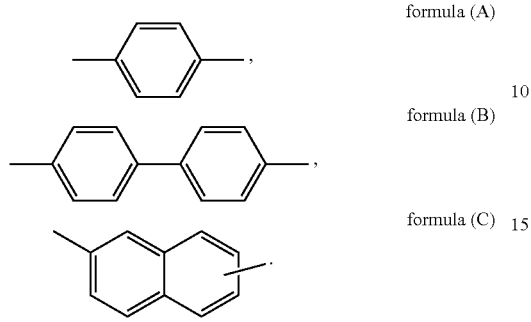

formula (A)

formula (B)

formula (C)

In detail, the material with the lowest dissipation factor currently on the market is liquid crystal polyester (LCP). At 10 GHz, the dissipation factor of the liquid crystal polyester can reach less than 0.0025, because the liquid crystal polyester has a local ordinal arrangement and a low-polar ester group, which results its low dissipation factor characteristic. Hence, in order to achieve low dissipation factor of the polyimide, the molecular chain of the polyimide needs to have a linear characteristic, and the selected monomer must also be considered to linear.

Figure 1A:
FIGS. 1A, 1B, 1C, 1D, 1E, 1F and 1G are schematic diagrams of an arrangement structure of molecular chains.
Figure 1B:
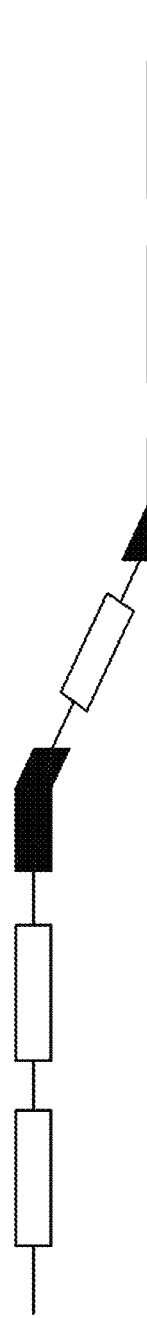
Figure 1C:
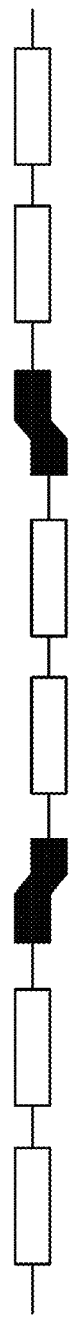
Figure 1D:
Figure 1E:
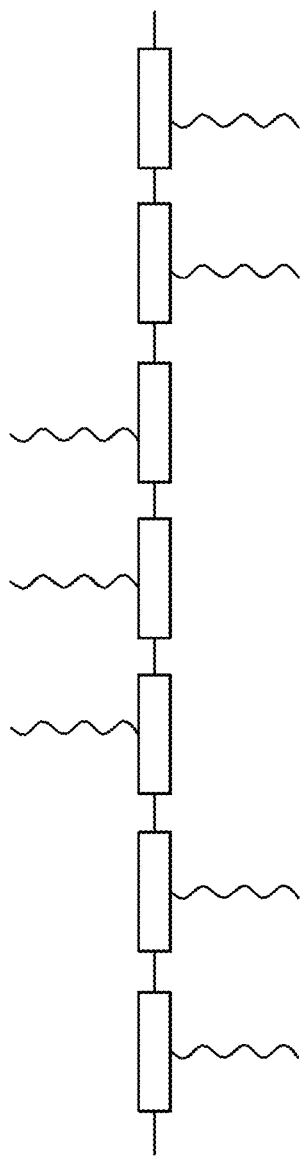
Figure 1F:
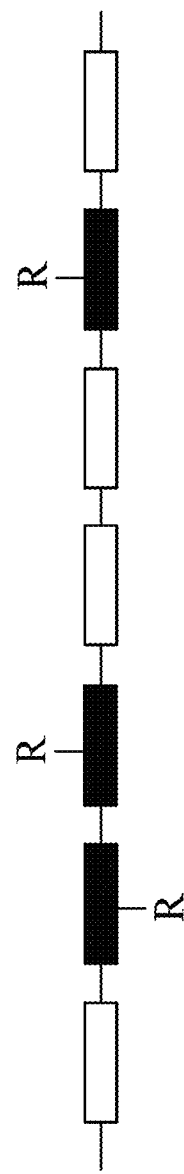
Figure 1G:
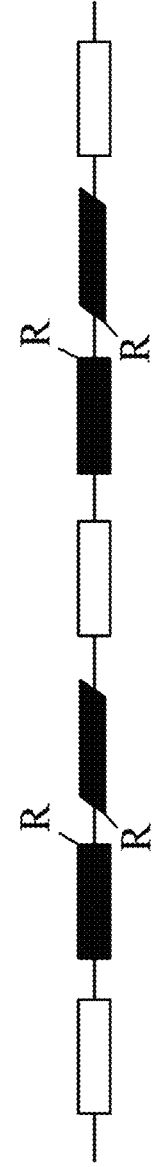

Please refer to FIGS. 1A, 1B, 1C, 1D, 1E, 1F and 1G, which are schematic diagrams of an arrangement structure of molecular chains. Specifically, if the arrangement structure of the molecular chain is too linear, it will cause to the poor processability or poor mechanical properties of the film (insufficient toughness), as shown in FIG. 1A, and the corresponding structure can be but not limited to a structure represented by formula (a-1), formula (a-2) or formula (a-3). Therefore, it is necessary to introduce non-linear or the monomer of side chain group to increase processability or mechanical properties of the film, as shown in FIGS. 1B, 1C, 1D, 1E, 1F and 1G, wherein R in FIGS. 1F and 1G represents a substituted group.

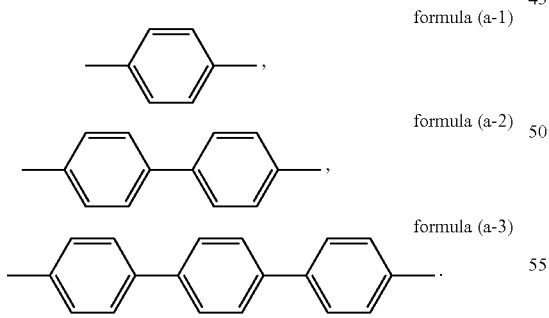

formula (a-1)

formula (a-2)

formula (a-3)

The common polyimide Kpaton (DuPont) is composed of 4,4'-oxyianiline (4,4'-ODA) and pyromellitic anhydride (PMDA). Although the molecular formulas of the liquid crystal polymer and the polyimide are different, the arrangement method of that is similar, so that the arrangement of the liquid crystal polymer can be used to simulate the molecular arrangement of the polyimide.

For example, if the polyimide molecular chain is arranged as shown in FIG. 1B, the corresponding structure can be but not limited to a structure represented by formula (b-1), formula (b-2) or formula (b-3), indicating that when 4,4'-ODA is used as the reactive monomer to react with the acid anhydride, the linearity of the polyimide molecular chain will be reduced.

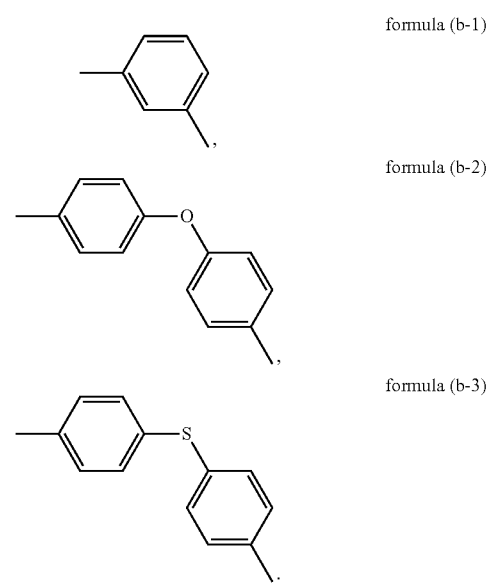

formula (b-1)

formula (b-2)

formula (b-3)

Furthermore, if the polyimide molecular chain is arranged as shown in FIG. 1C, the corresponding structure can be but not limited to a structure represented by formula (c-1) or formula (c-2), indicating that when 3,4'-oxydianiline (3,4'-ODA) or 4,4'-diaminobenzophenone is used as the reactive monomer to react with the acid anhydride, the processability compared with the arrangement structure of FIG. 1A can be improved, and the linearity of the molecular chain compared with the arrangement structure of FIG. 1B can still be maintained. However, the polarity of the carbonyl group of 4,4'-diaminobenzophenone is relatively high, which is unfavorable for the dissipation factor. The carbonyl group is an electron-withdrawing substituent, which will cause the diamine has the low reactivity and is unfavorable for polymerizing into the polymer. The polarity of the oxy group of 3,4'-ODA is relatively lower than the carbonyl group. The oxy group is an electron-donating substituent, so the diamine has the high reactivity to be good for polymerizing into the polymer.

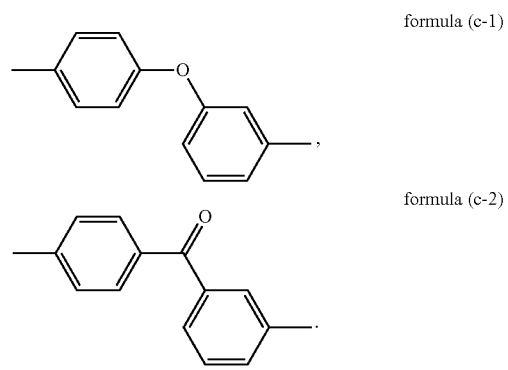

formula (c-1)

formula (c-2)

Hence, the polymerization of 3,4'-ODA, 4,4'-ODA or the mixture thereof and the dianhydride in the present disclosure should be satisfied with the polyimide having a linear arrangement structure and the high processability.

Moreover, in addition to use 3,4'-ODA, 4,4'-ODA or the mixture thereof as the diamine monomer, the present disclosure also intends to introduce the ester structure into the polyimide to maintain the linearity of the molecular chain. Please refer to FIG. 2, which is a single crystal XRD diagram of formula (D), wherein the formula (D) is a structure with an ester group introduced, as shown below:

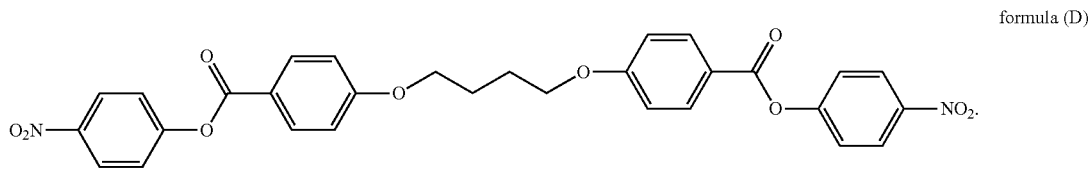 [SMILES: O=C(Oc1ccc([N+](=O)[O-])cc1)c1ccc(OCCCCOc2ccc(C(=O)Oc3ccc([N+](=O)[O-])cc3)cc2)cc1]

formula (D)

Figure 2:
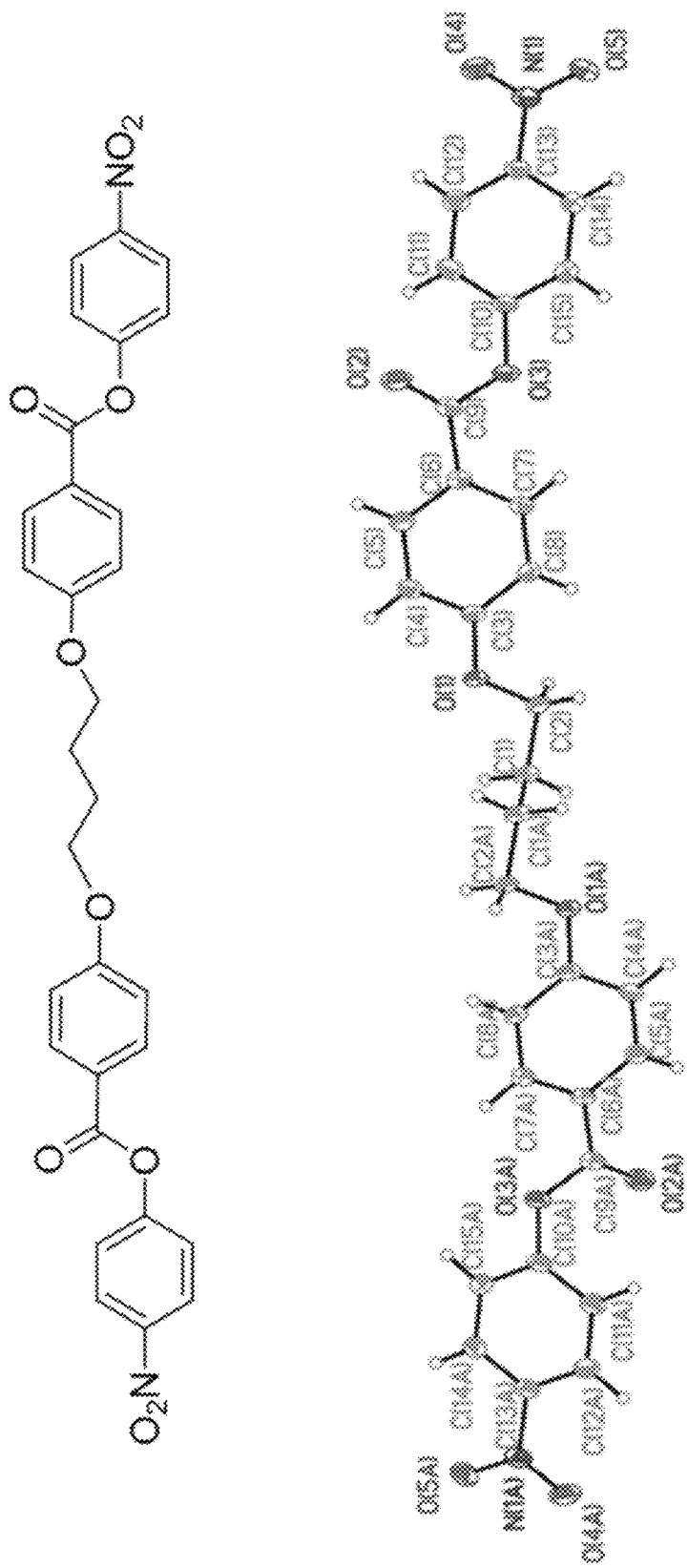
FIG. 2 is a single crystal XRD diagram of formula (D).

As known the single crystal XRD diagram in FIG. 2, the formula (D) with the introduction of the ester group structure can indeed maintain the linearity of the molecular. There are two methods to introduce the ester group, one is to introduce the ester group into the diamine, and the other is to introduce the ester group into the dianhydride.

Polyimide Film

A polyimide film is provided of the present disclosure, which includes the aforementioned polyimide. Specifically, in the formula (I), when x is 1 and Ar is the structure represented by formula (A), the polyimide has a structure represented by formula (I-A):

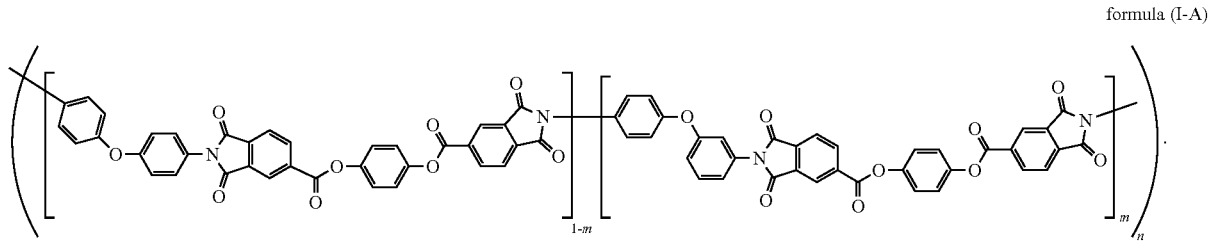

formula (I-A)

At this time, a dielectric constant of the prepared polyimide film can be 2.8 to 3.5, and a dissipation factor can be less than 0.0025.

Flexible Copper Clad Laminate

A low-dissipation flexible copper clad laminate is provided of the present disclosure, which includes a copper foil and the aforementioned polyimide film. The polyimide film is attached to the copper foil, and the copper foil is any kind of copper foil used for flexible copper clad laminate known in the art, and will not be described herein. Hence, due to the polyimide film has the low dielectric constant and the low dissipation factor, the prepared flexible copper clad laminate has the low dissipation factor. Furthermore, when the flexible copper clad laminate is applied to the flexible circuit board, the electrical interference between the circuits will be reduced, which is favorable for avoiding the power load and the signal delay.

Manufacturing Method for Low-Dissipation Flexible Copper Clad Laminate

Figure 3:
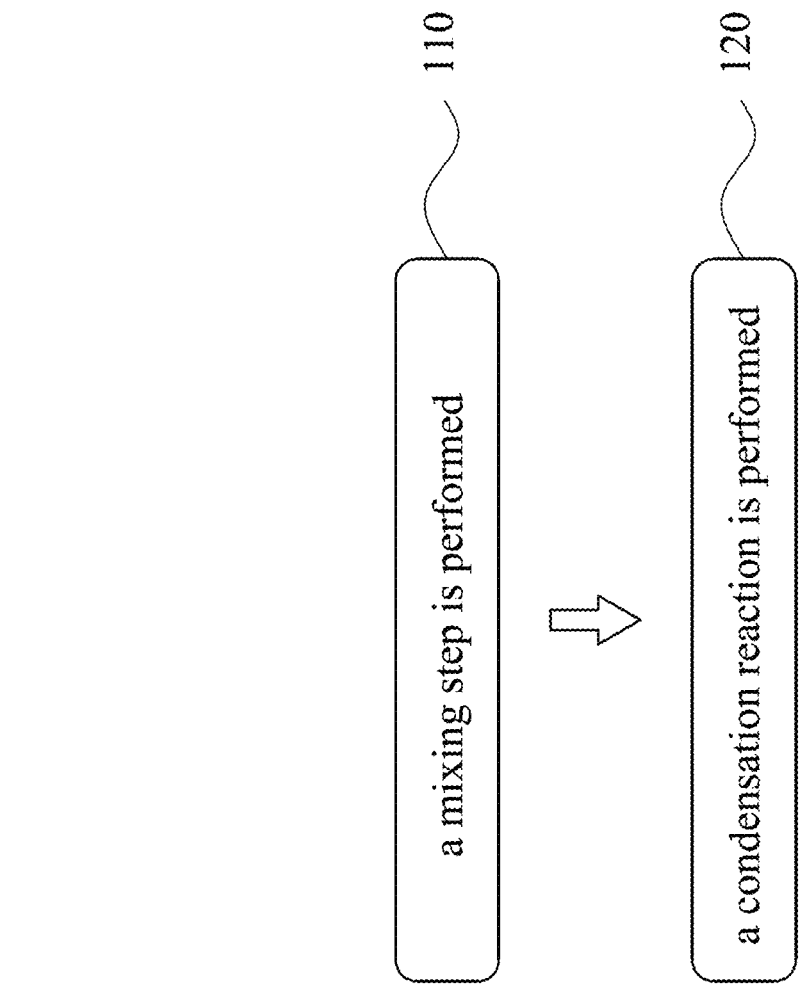
FIG. 3 is a flow chart of a manufacturing method for a low-dissipation flexible copper clad laminate according to one embodiment of the present disclosure.

Please refer to FIG. 3, which is a flow chart of a manufacturing method for a low-dissipation flexible copper clad laminate 100 according to one embodiment of the present disclosure. In FIG. 3, the manufacturing method for the low-dissipation flexible copper clad laminate 100 includes a step 110 and a step 120.

In the step 110, a mixing step is performed, wherein a diamine monomer represented by formula (i) and a diamine monomer represented by formula (ii) are dissolved in an organic solvent, and then a dianhydride monomer represented by formula (iii) is added to form a polyamic acid solution:

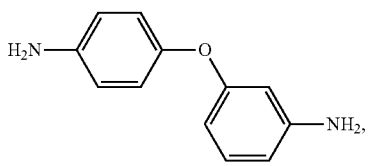

formula (i)

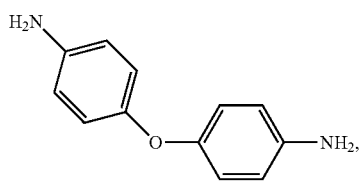

formula (ii)

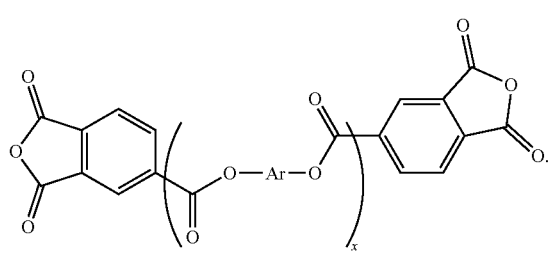

formula (iii)

The definition of Ar and x can refer to the aforementioned paragraph, and will not be described herein.

In the step 120, a condensation reaction is performed, wherein the polyamic acid solution is coated on the copper foil, and performed the heat and ring-closing to obtain the low-dissipation flexible copper clad laminate.

Specifically, the organic solvent used in the mixing step can be but not limited to dimethylacetamide (DMAc), dimethylformamide (DMF) or N-methyl-2-pyrrolidone (NMP). However, in the mixing step, a molar ratio of the aforementioned diamine monomer represented by formula (i) plus the aforementioned diamine monomer represented by formula (ii) to the aforementioned dianhydride monomer represented by formula (iii) can be 0.9 to 1.1. Then, in the condensation reaction, after coating the polyamic acid solution on the copper foil and heating to remove the organic solvent, the polyimide film containing the polyimide represented by formula (I) can be synthesized, and the flexible copper clad laminate formed by attaching the copper foil and the polyimide film can be obtained. The coating method can be but not limited to a knife coating method or a spin coating method.

Electronic Device

An electronic device is provided of the present disclosure, which includes the aforementioned low-dissipation flexible copper clad laminate. The low-dissipation flexible copper clad laminate can refer to the aforementioned paragraph, and will not be described herein. The structure and manufacturing method of the electronic device is a conventional technique, and will not be described herein.

The present disclosure will be further exemplified by the following specific embodiments so as to facilitate utilizing and practicing the present disclosure completely by the people skilled in the art without over-interpreting and over-experimenting. However, the readers should understand that the present disclosure should not be limited to these practical details thereof, that is, these practical details are used to describe how to implement the materials and methods of the present disclosure and are not necessary.

Example/Comparative Example

Example 1: 0.5 g (2.497 mmol) of 3,4'-ODA diamine monomer and 1.5 g (7.491 mmol) of 4,4'-ODA diamine monomer are dissolved in 38 g of the dewatered DMAc (15 wt %). After the diamine monomers are completely dissolved, adding 4.5778 g (9.988 mmol) of p-Phenylene bis(trimellitate) dianhydride (TAHQ), and stirring for 24 hours under the nitrogen atmosphere. Next, controlling the thickness of the scraper to 400 μm and coating to the copper foil, then placing it at the circulating oven so as to heat to 150° C. for 20 minutes. After drying most of the solvent, the temperature is increased to 150° C. for 30 minutes, 200° C. for an hour, 250° C. for an hour, and 300° C. for an hour to obtain the single-sided flexible copper clad laminate of Example 1 for testing the heat resistant of solder float. Then, the copper clad laminate is etched to obtain the polyimide film of Example 1 for testing the electrical. The reaction scheme of Example 1 is shown in Table 1.

TABLE 1

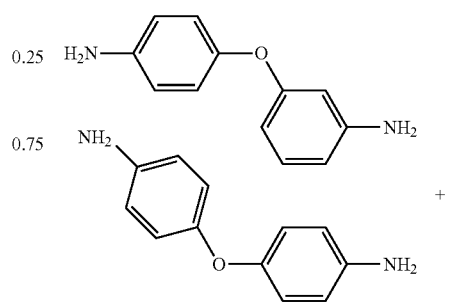 [SMILES: Nc1ccc(Oc2cccc(N)c2)cc1 ; Nc1ccc(Oc2ccc(N)cc2)cc1]

+

TABLE 1-continued

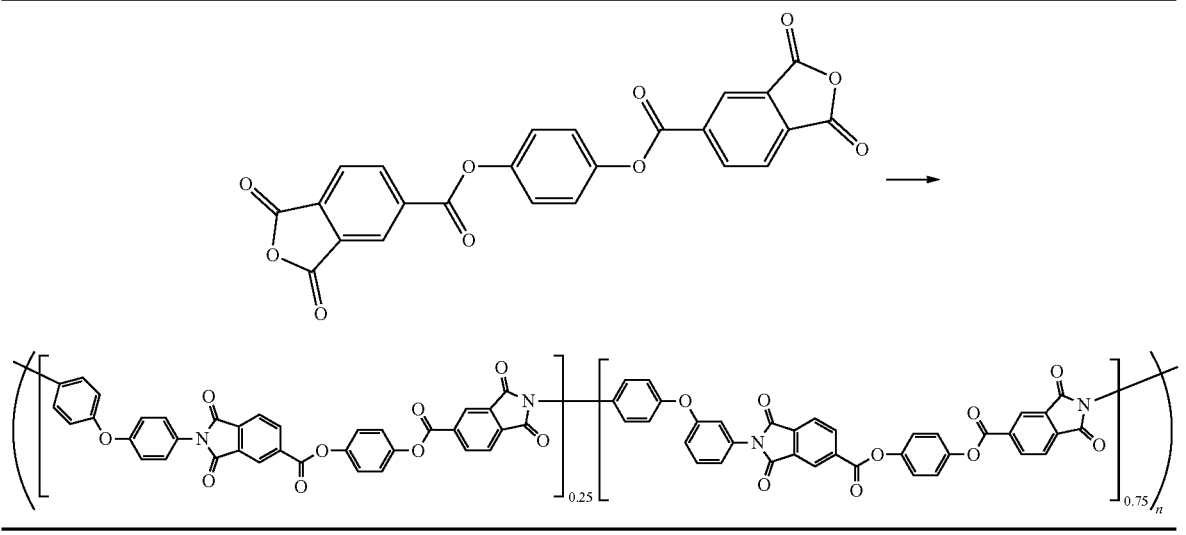

Example 2: 1.0 g (4.994 mmol) of 3,4'-ODA diamine monomer and 1.0 g (4.994 mmol) of 4,4'-ODA diamine monomer are dissolved in 38 g of the dewatered DMAc (15 wt %). After the diamine monomers are completely dissolved, adding 4.5778 g (9.988 mmol) of TAHQ dianhydride monomer, and stirring for 24 hours under the nitrogen atmosphere. The subsequent steps are the same as Example 1, and the single-sided flexible copper clad laminate of Example 2 can be obtained for testing the heat resistant of solder float. Then, the copper clad laminate is etched to obtain the polyimide film of Example 2 for testing the electrical. The reaction scheme of Example 2 is shown in Table 2.

TABLE 2

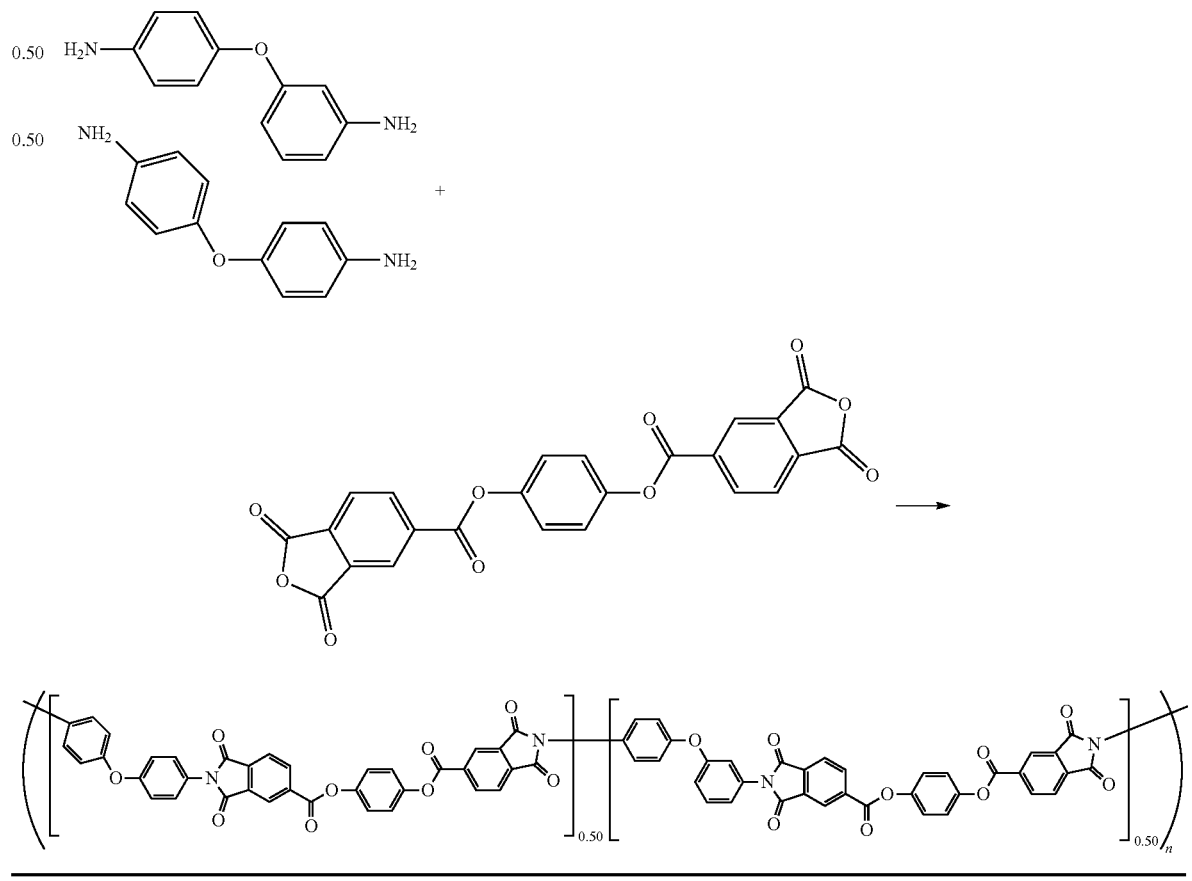

Example 3: 1.5 g (7.491 mmol) of 3,4'-ODA diamine monomer and 0.5 g (2.497 mmol) of 4,4'-ODA diamine monomer are dissolved in 38 g of the dewatered DMAc (15 wt %). After the diamine monomers are completely dissolved, adding 4.5778 g (9.988 mmol) of TAHQ dianhydride monomer, and stirring for 24 hours under the nitrogen atmosphere. The subsequent steps are the same as Example 1, and the single-sided flexible copper clad laminate of Example 3 can be obtained for testing the heat resistant of solder float. Then, the copper clad laminate is etched to obtain the polyimide film of Example 3 for testing the electrical. The reaction scheme of Example 3 is shown in Table 3.

TABLE 3

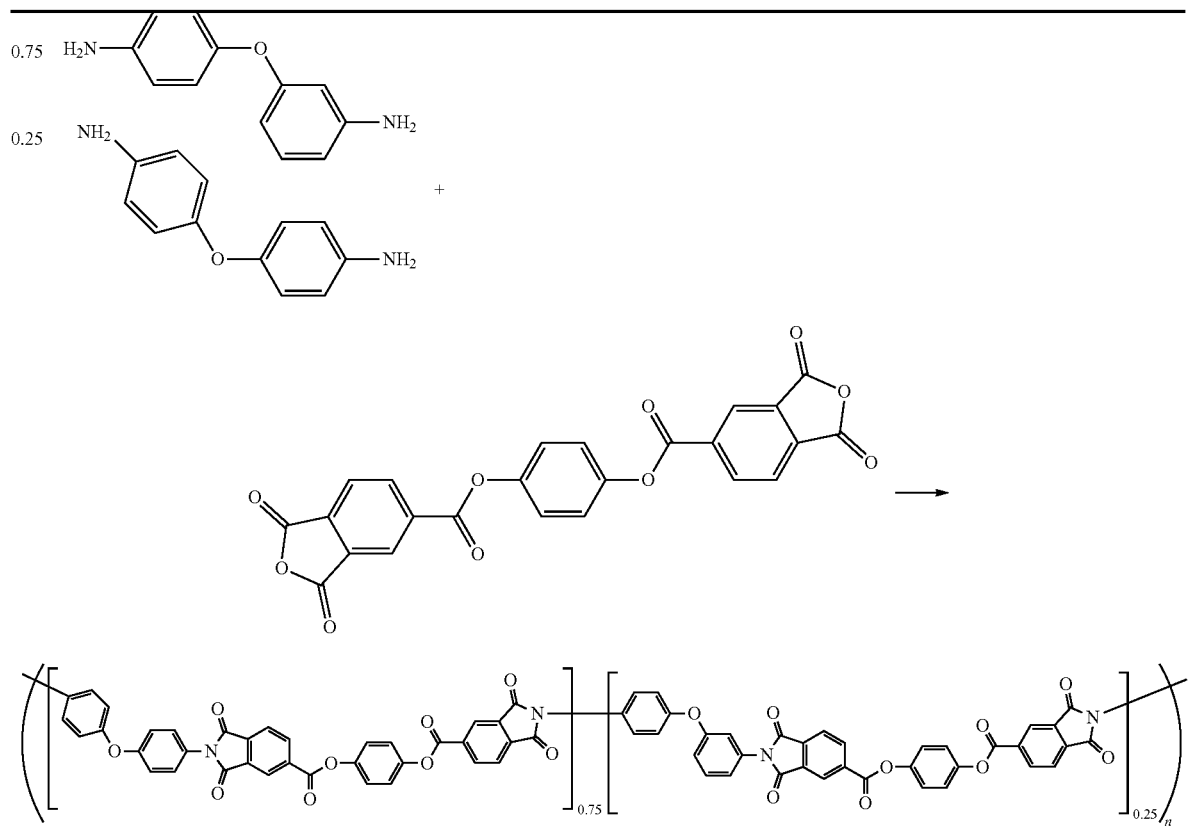

Example 4: 2 g (9.988 mmol) of 3,4'-ODA diamine monomer is dissolved in 29.97 g of the dewatered DMAc (18 wt %). After the diamine monomer is completely dissolved, adding 4.5778 g (9.988 mmol) of TAHQ dianhydride monomer, and stirring for 24 hours under the nitrogen atmosphere. The subsequent steps are the same as Example 1, and the single-sided flexible copper clad laminate of Example 4 can be obtained for testing the heat resistant of solder float. Then, the copper clad laminate is etched to obtain the polyimide film of Example 4 for testing the electrical. The reaction scheme of Example 4 is shown in Table 4.

TABLE 4

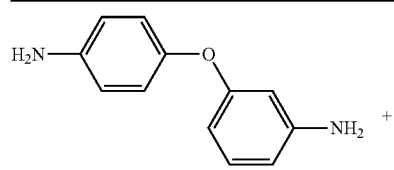

TABLE 4-continued

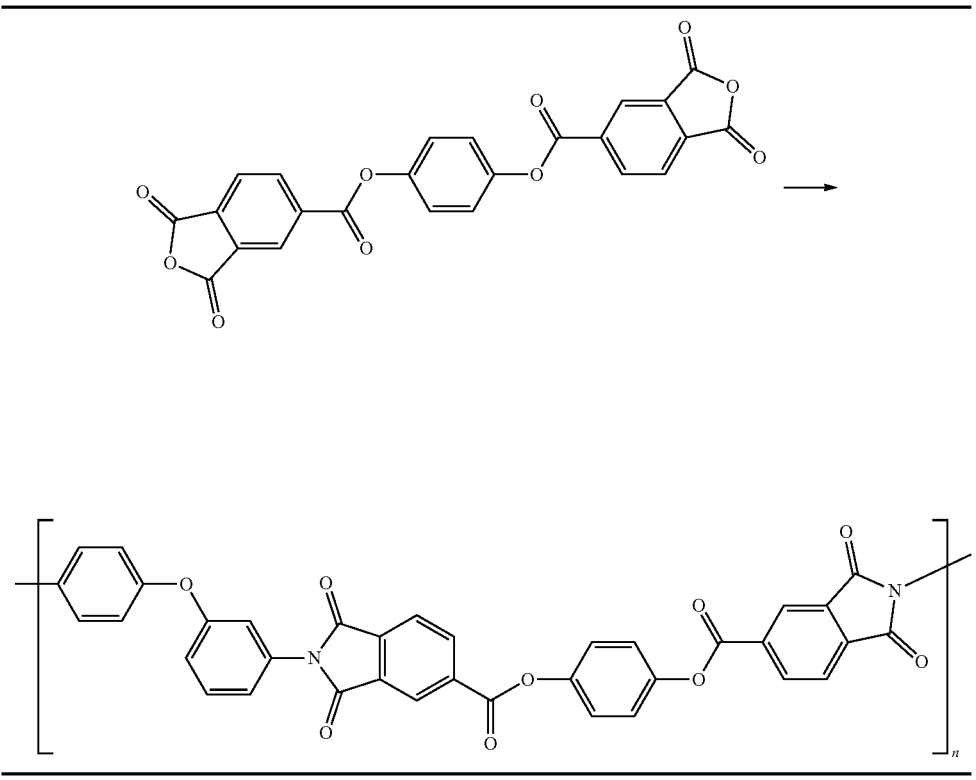

Example 5: 2 g (9.988 mmol) of 4,4'-ODA diamine monomer is dissolved in 29.97 g of the dewatered DMAc (18 wt %). After the diamine monomer is completely dissolved, adding 4.5778 g (9.988 mmol) of TAHQ dianhydride monomer, and stirring for 24 hours under the nitrogen atmosphere. The subsequent steps are the same as Example 1, and the single-sided flexible copper clad laminate of Example 5 can be obtained for testing the heat resistant of solder float. Then, the copper clad laminate is etched to obtain the polyimide film of Example 5 for testing the electrical. The reaction scheme of Example 5 is shown in Table 5.

TABLE 5

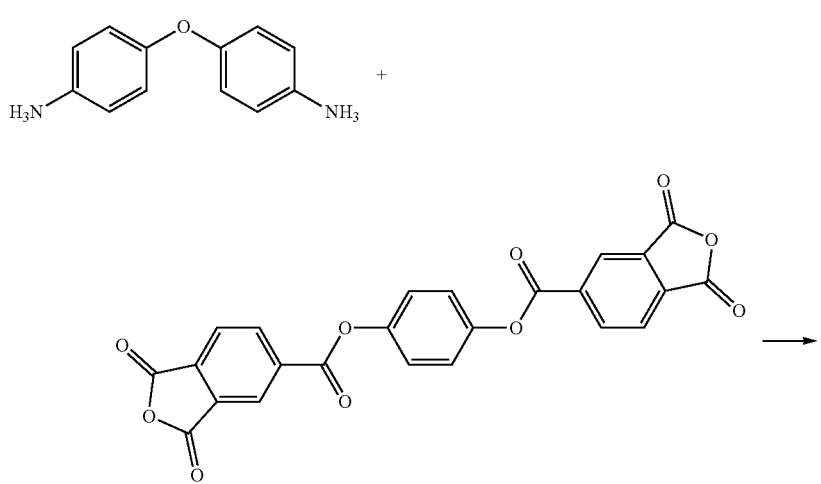

TABLE 5-continued

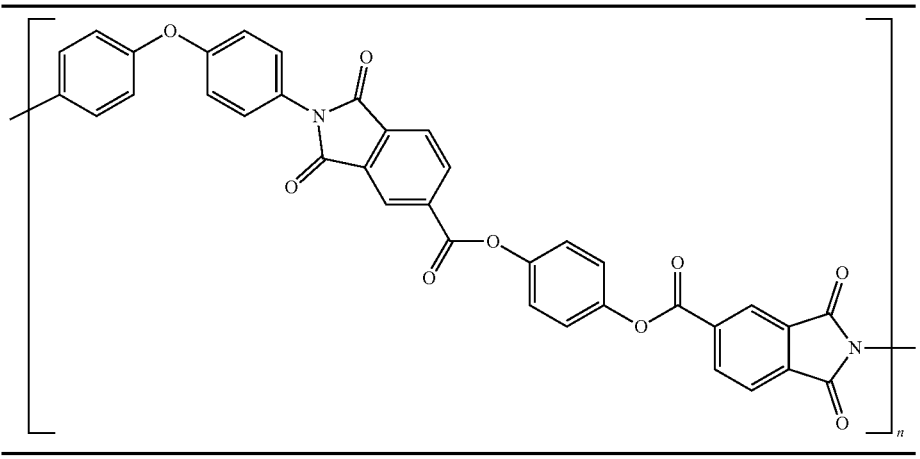

Example 6: 2 g (9.988 mmol) of 3,4'-ODA diamine monomer is dissolved in 16.71 g of the dewatered DMAc (20 wt %). After the diamine monomer is completely dissolved, adding 2.1786 g (9.988 mmol) of PMDA dianhydride monomer, and stirring for 24 hours under the nitrogen atmosphere. The subsequent steps are the same as Example 1, and the single-sided flexible copper clad laminate of Example 6 can be obtained for testing the heat resistant of solder float. Then, the copper clad laminate is etched to obtain the polyimide film of Example 6 for testing the electrical. The reaction scheme of Example 6 is shown in Table 6.

TABLE 6

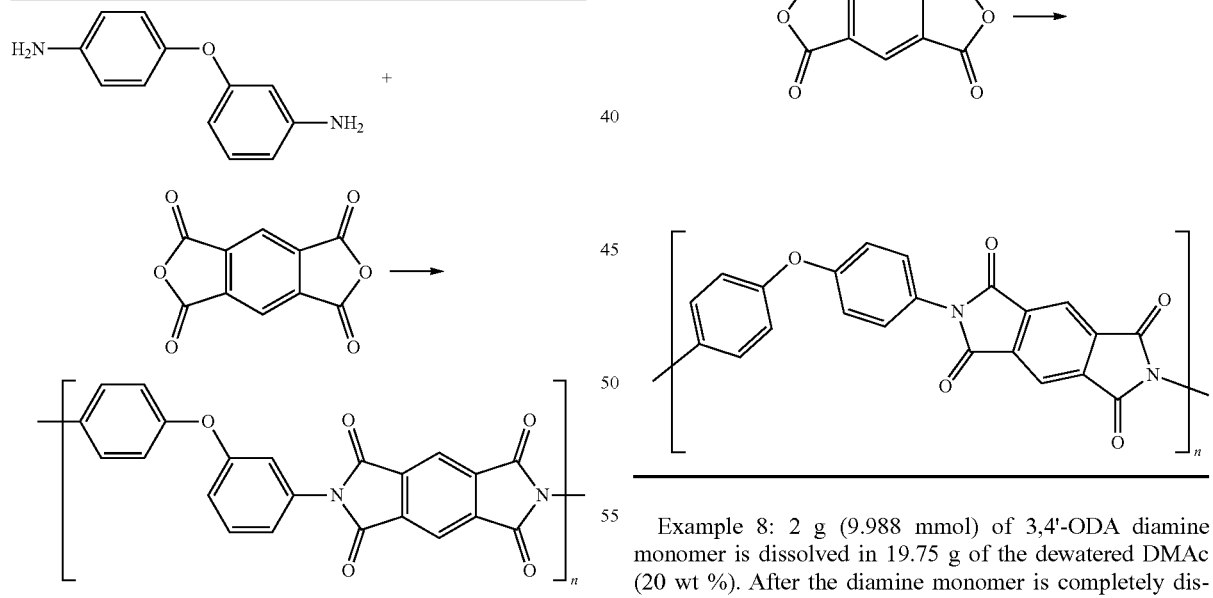

Example 7: 2 g (9.988 mmol) of 4,4'-ODA diamine monomer is dissolved in 16.71 g of the dewatered DMAc (20 wt %). After the diamine monomer is completely dissolved, adding 2.1786 g (9.988 mmol) of PMDA dianhydride monomer, and stirring for 24 hours under the nitrogen atmosphere. The subsequent steps are the same as Example 1, and the single-sided flexible copper clad laminate of Example 7 can be obtained for testing the heat resistant of solder float. Then, the copper clad laminate is etched to obtain the polyimide film of Example 7 for testing the electrical. The reaction scheme of Example 7 is shown in Table 7.

TABLE 7

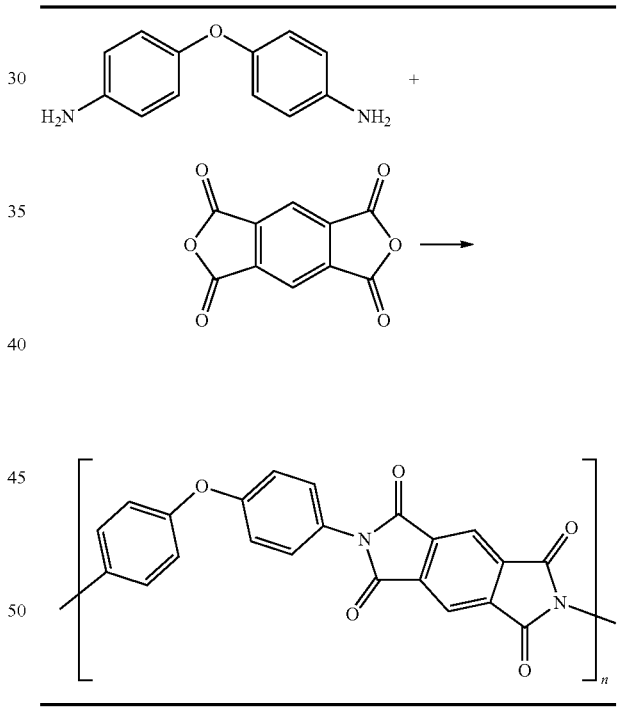

Example 8: 2 g (9.988 mmol) of 3,4'-ODA diamine monomer is dissolved in 19.75 g of the dewatered DMAc (20 wt %). After the diamine monomer is completely dissolved, adding 2.9387 g (9.988 mmol) of 3,3',4,4'-biphenyltetracarboxylic dianhydride (BPDA), and stirring for 24 hours under the nitrogen atmosphere. The subsequent steps are the same as Example 1, and the single-sided flexible copper clad laminate of Example 8 can be obtained for testing the heat resistant of solder float. Then, the copper clad laminate is etched to obtain the polyimide film of Example 8 for testing the electrical. The reaction scheme of Example 8 is shown in Table 8.

TABLE 8

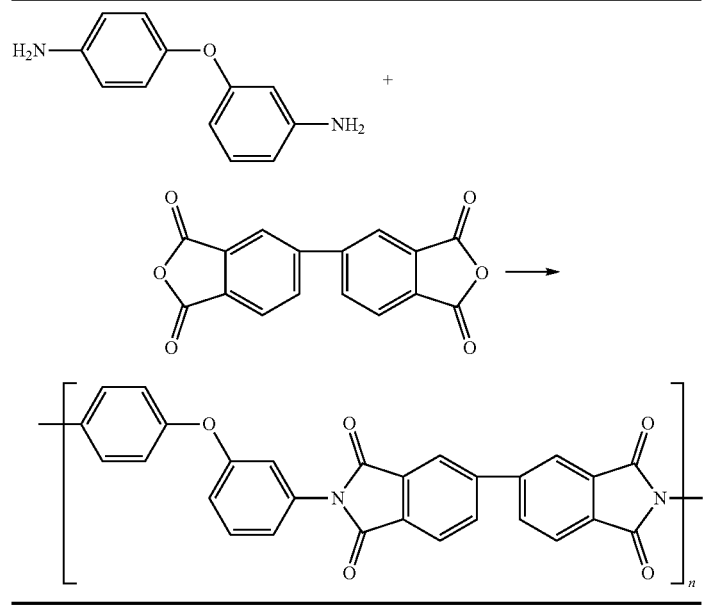

Example 9: 2 g (9.988 mmol) of 4,4'-ODA diamine monomer is dissolved in 19.75 g of the dewatered DMAc (20 wt %). After the diamine monomer is completely dissolved, adding 2.9387 g (9.988 mmol) of BPDA dianhydride monomer, and stirring for 24 hours under the nitrogen atmosphere. The subsequent steps are the same as Example 1, and the single-sided flexible copper clad laminate of Example 9 can be obtained for testing the heat resistant of solder float. Then, the copper clad laminate is etched to obtain the polyimide film of Example 9 for testing the electrical. The reaction scheme of Example 9 is shown in Table 9.

TABLE 9

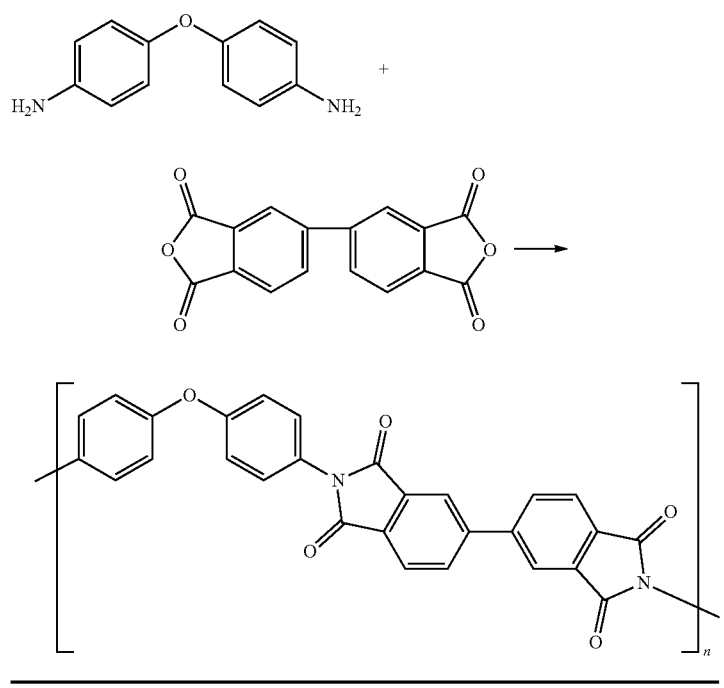

Comparative Example 1: 1 g (2.87 mmol) of 1,4-bis(4-aminobenzo-yloxy)benzene (HQ-NH$_2$) is dissolved in 9.08 g of the dewatered DMAc (25 wt %). After the diamine monomer is completely dissolved, adding 1.27 g (2.87 mmol) of 4,4'-(hexafluoroisopropylidene)diphthalic anhydride (6FDA), and stirring for 24 hours under the nitrogen atmosphere. The subsequent steps are the same as Example 1, and the single-sided flexible copper clad laminate of Comparative Example 1 can be obtained for testing the heat resistant of solder float. Then, the copper clad laminate is etched to obtain the polyimide film of Comparative Example 1 for testing the electrical. The reaction scheme of Comparative Example 1 is shown in Table 10.

TABLE 10

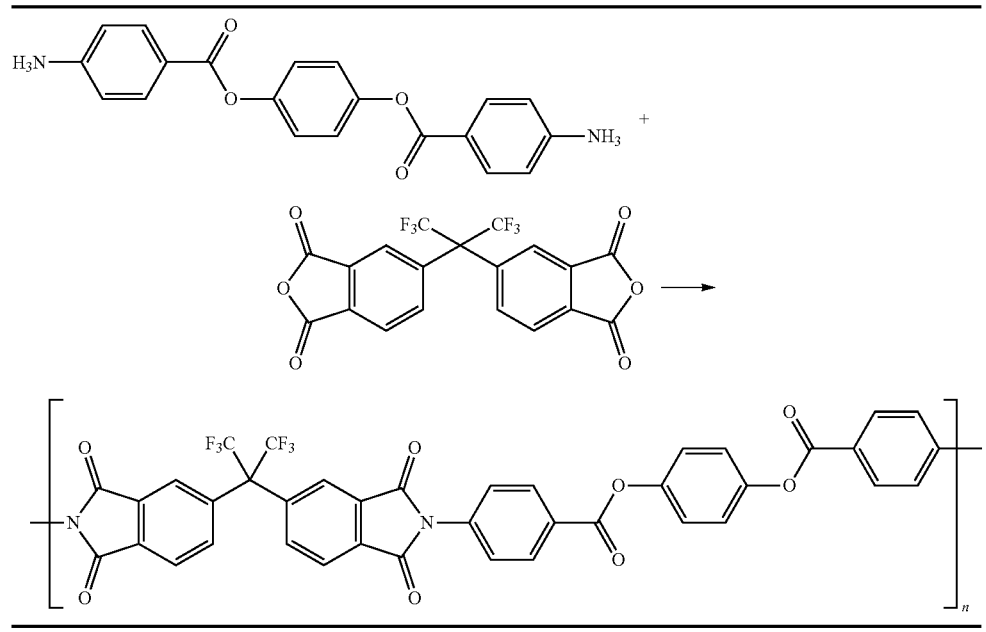

Comparative Example 2: 1 g (2.87 mmol) of bis(4-aminophenyl)terephthalate (TP-NH$_2$) is dissolved in 9.08 g of the dewatered DMAc (25 wt %). After the diamine monomer is completely dissolved, adding 1.27 g (2.87 mmol) of 6FDA dianhydride monomer, and stirring for 24 hours under the nitrogen atmosphere. The subsequent steps are the same as Example 1, and the single-sided flexible copper clad laminate of Comparative Example 2 can be obtained for testing the heat resistant of solder float. Then, the copper clad laminate is etched to obtain the polyimide film of Comparative Example 2 for testing the electrical. The reaction scheme of Comparative Example 2 is shown in Table 11.

TABLE 11

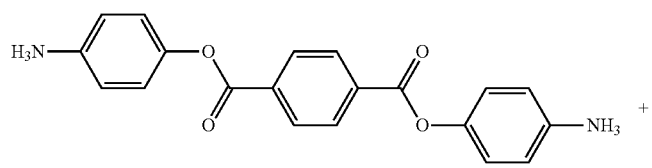 [SMILES: Nc1ccc(OC(=O)c2ccc(C(=O)Oc3ccc(N)cc3)cc2)cc1]

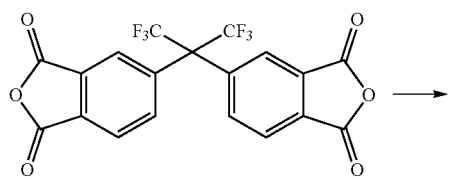 [SMILES: O=C1OC(=O)c2cc(C(c3ccc4c(c3)C(=O)OC4=O)(C(F)(F)F)C(F)(F)F)ccc21]

TABLE 11-continued

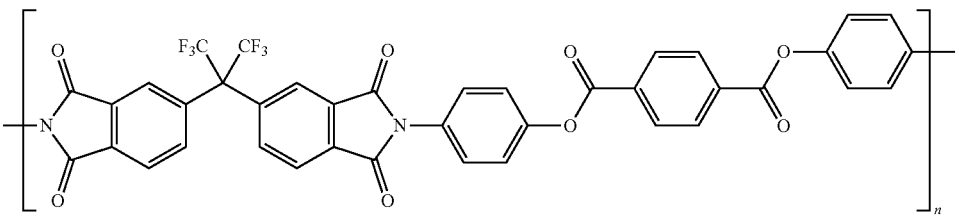

Comparative Example 3: 1 g (2.87 mmol) of TP-NH$_2$ diamine monomer is dissolved in 6.96 g of the dewatered DMAc (25 wt %). After the diamine monomer is completely dissolved, adding 1.32 g (2.87 mmol) of TAHQ dianhydride monomer, and stirring for 24 hours under the nitrogen atmosphere. The subsequent steps are the same as Example 1, and the single-sided flexible copper clad laminate of Comparative Example 3 can be obtained for testing the heat resistant of solder float. Then, the copper clad laminate is etched to obtain the polyimide film of Comparative Example 3 for testing the electrical. The reaction scheme of Comparative Example 3 is shown in Table 12.

TABLE 12

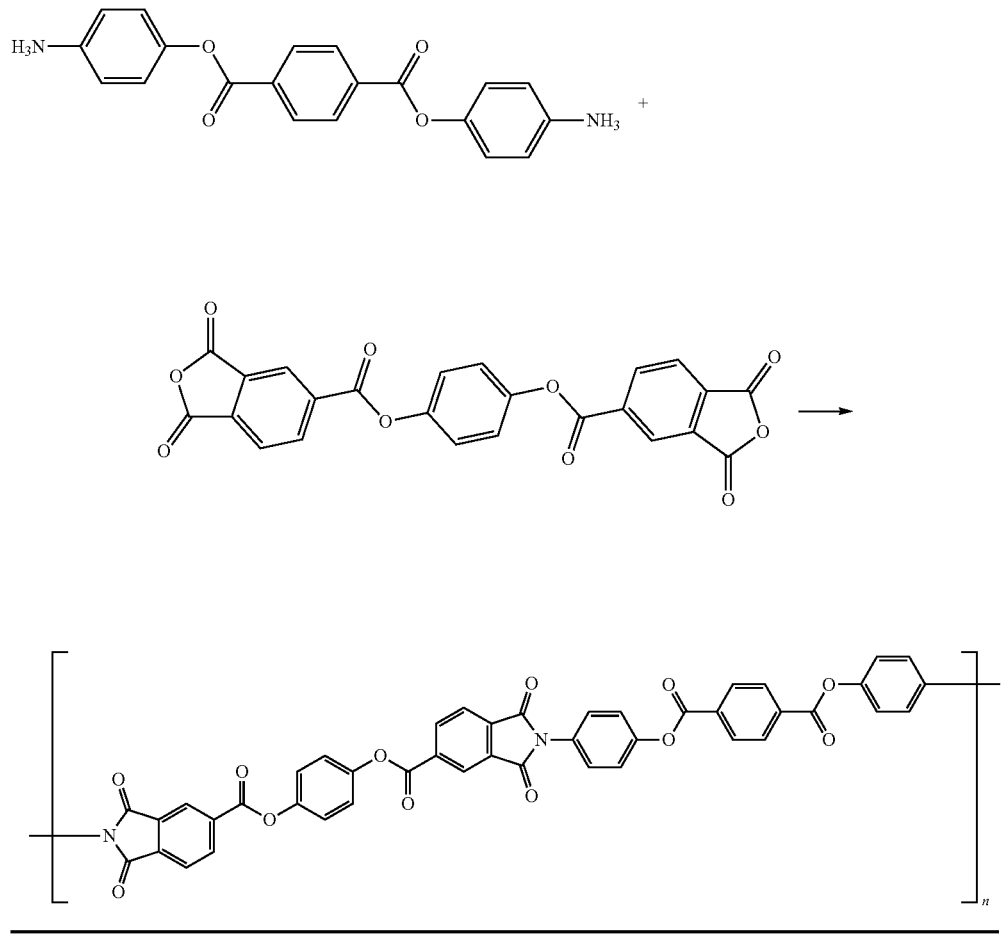

Comparative Example 4: 3.06 g (8.8 mmol) of TP-NH$_2$ diamine monomer is dissolved in 19.92 g of the dewatered NMP (20 wt %). After the diamine monomer is completely dissolved, adding 1.92 g (8.8 mmol) of PMDA dianhydride monomer, and stirring for 24 hours under the nitrogen atmosphere. The subsequent steps are the same as Example 1, and the single-sided flexible copper clad laminate of Comparative Example 4 can be obtained for testing the heat resistant of solder float. Then, the copper clad laminate is etched to obtain the polyimide film of Comparative Example 4 for testing the electrical. The reaction scheme of Comparative Example 4 is shown in Table 13.

TABLE 13

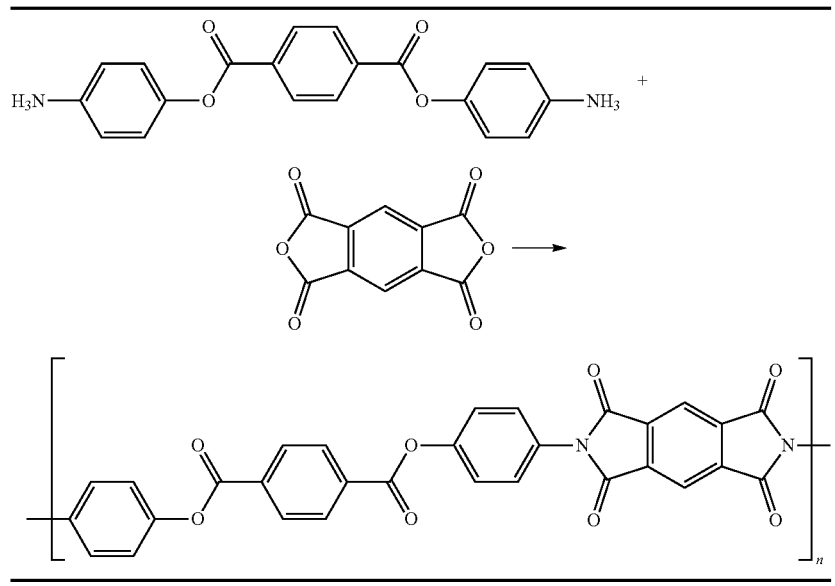

Comparative Example 5: 2 g (8.8 mmol) of 4-aminophenyl 4-aminobenzoate (APAB) is dissolved in 24.68 g of the dewatered NMP (20 wt %). After the diamine monomer is completely dissolved, adding 7.72 g (8.8 mmol) of TAHQ dianhydride monomer, and stirring for 24 hours under the nitrogen atmosphere. The subsequent steps are the same as Example 1, and the single-sided flexible copper clad laminate of Comparative Example 5 can be obtained for testing the heat resistant of solder float. Then, the copper clad laminate is etched to obtain the polyimide film of Comparative Example 5 for testing the electrical. The reaction scheme of Comparative Example 5 is shown in Table 14.

TABLE 14

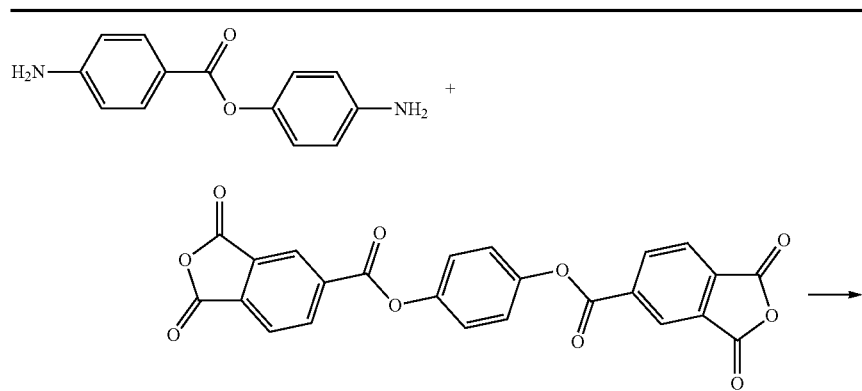

TABLE 14-continued

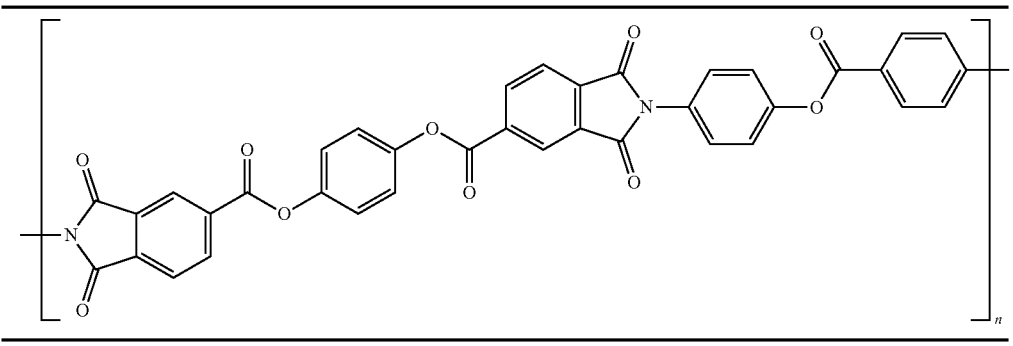

Comparative Example 6: 0.9516 g (8.8 mmol) of p-Phenylenediamine (PPD) is dissolved in 24.68 g of the dewatered NMP (20 wt %). After the diamine monomer is completely dissolved, adding 7.72 g (8.8 mmol) of TAHQ dianhydride monomer, and stirring for 24 hours under the nitrogen atmosphere. The subsequent steps are the same as Example 1, and the single-sided flexible copper clad laminate of Comparative Example 6 can be obtained for testing the heat resistant of solder float. Then, the copper clad laminate is etched to obtain the polyimide film of Comparative Example 6 for testing the electrical. The reaction scheme of Comparative Example 6 is shown in Table 15.

TABLE 15

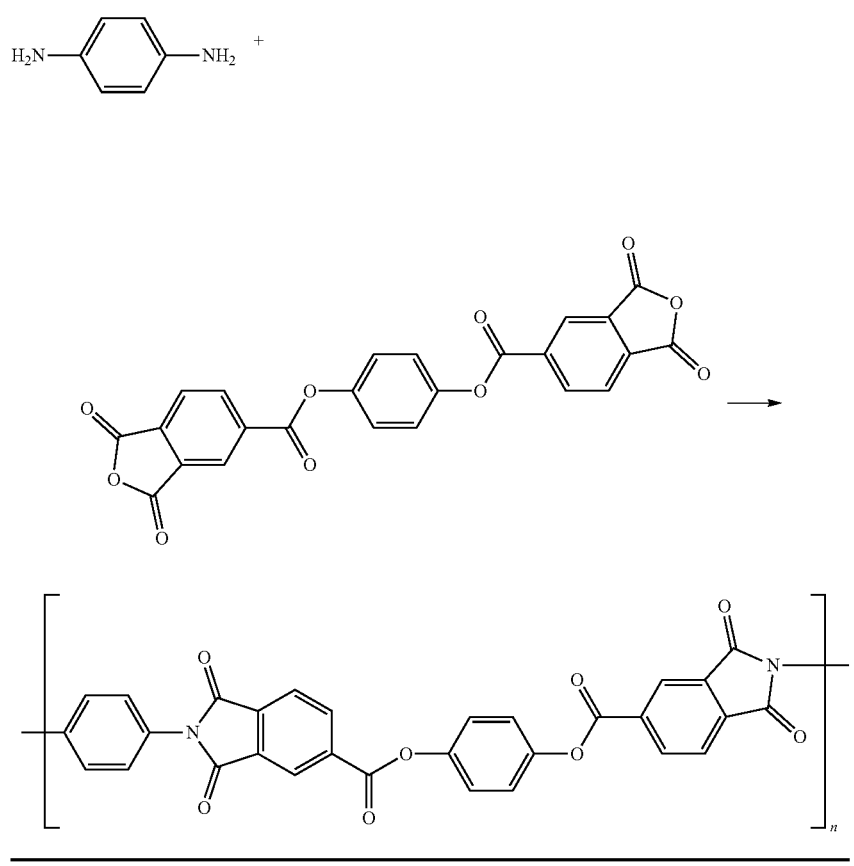

Evaluation Test Method

Heat resistant of solder float test: the prepared single-sided flexible copper clad laminate is placed at 288° C. for solder floating for 10 seconds, and the test is performed three times to visually check the blisters or not.

Dielectric analysis method: first, the prepared polyimide film is dried and removed water at 120° C. for 1 hour, then placed at a dielectric constant analysis with 10 GHz to perform the dielectric analysis to test three times for taking the average value. The label and the model of the dielectric constant analysis is Rohde & Schwarz Taiwan Ltd./steel/ZNB20. The dielectric constant ($D_k$) and the dissipation factor ($D_f$) of the cured film is tested at 10 GHz, the cured film should be less than or equal to 350 µm. The cured film is cut to 9 cm×13 cm and measured at the room temperature.

Example 1 to Example 9 and Comparative Example 1 to Comparative Example 6 are performed the aforementioned evaluation test method, and the results are recorded in Table 16.

TABLE 16

| | diamine | dianhydride | Film forming | Heat resistant of solder float | $D_k$ | $D_f$ |
|---|---|---|---|---|---|---|
| Example 1 | 3,4'-ODA/ 4,4'-ODA = 1/3 | TAHQ | ○ | Pass | 3.3 | 0.0018 |
| Example 2 | 3,4'-ODA/ 4,4'-ODA = 1/1 | TAHQ | ○ | Pass | 3.2 | 0.0015 |
| Example 3 | 3,4'-ODA/ 4,4'-ODA = 3/1 | TAHQ | ○ | Pass | 3.1 | 0.0014 |
| Example 4 | 3,4'-ODA | TAHQ | ○ | Pass | 3.0 | 0.0017 |
| Example 5 | 4,4'-ODA | TAHQ | ○ | Pass | 3.0 | 0.0023 |
| Example 6 | 3,4'-ODA | PMDA | ○ | Pass | 3.5 | 0.014 |
| Example 7 | 4,4'-ODA | PMDA | ○ | Pass | 3.5 | 0.016 |
| Example 8 | 3,4'-ODA | BPDA | ○ | Pass | 3.1 | 0.0043 |
| Example 9 | 4,4'-ODA | BPDA | ○ | Pass | 3.1 | 0.0045 |
| Comparative Example 1 | HQ-NH$_2$ | 6FDA | ○ | Pass | 3.01 | 0.016 |
| Comparative Example 2 | TP-NH$_2$ | 6FDA | ○ | Pass | 2.96 | 0.011 |
| Comparative Example 3 | TP-NH$_2$ | TAHQ | X | X | — | — |
| Comparative Example 4 | TP-NH$_2$ | PMDA | X | X | — | — |
| Comparative Example 5 | APAB | TAHQ | X | X | — | — |
| Comparative Example 6 | PPD | TAHQ | X | X | 3.4 | 0.0035 |

It can be seen from the results in Table 16, when the dianhydride structure is fixed, the effects of 3,4'-ODA and 4,4'-ODA on the dissipation factor can be compared. For example, compared with Example 4 and Example 5, the dissipation factor is 0.0017 and 0.0023, respectively. Compared with Example 6 and Example 7, the dissipation factor is 0.014 and 0.016, respectively. Compared with Example 8 and Example 9, the dissipation factor is 0.0043 and 0.0045, respectively. It can be found that the polyimide composed of 3,4'-ODA diamine monomer has lower dissipation factor characteristic, which is related to the better linearity of 3,4'-ODA.

Furthermore, when the diamine structure is fixed, the effects of different dianhydride on the dissipation factor can be compared. For example, compared with Example 4, Example 6 and Example 8, the dissipation factor is 0.0017, 0.014 and 0.0043, respectively. Compared with Example 5, Example 7 and Example 9, the dissipation factor is 0.0023, 0.016 and 0.0045, respectively. It can be found that in the dianhydride structure, TAHQ is better than BPDA, and BPDA is better than PMDA. Therefore, the dianhydride containing the ester group is the important raw material for causing the low dissipation factor.

However, as known from Comparative Example 3 to Comparative Example 5, the polyimide film containing the ester group has the poor film forming property, the reason may be that the para-position of the amine group is an electron-withdrawing ester group, resulting in the poor reactivity of the amine group. As known from Comparative Example 1 and Comparative Example 2, the diamine containing the ester group can be formed the polyimide with the highly reactive 6FDA, but the dissipation factor is 0.016 and 0.011, respectively, which do not have the low dissipation factor characteristic. Then, as known from Comparative Example 6, when p-Phenylenediamine with the most symmetric structure is used as the monomer, which is designed according to the principle of formula (a-1), the polyimide film formed by p-Phenylenediamine and THAQ has poor mechanical property and insufficient toughness.

Therefore, as known from the aforementioned results that the polyimide synthesized with the 3,4'-ODA diamine monomer and the ester group-containing TAHQ dianhydride monomer has the characteristics of low dielectric constant and low dissipation factor. However, the price of 3,4'-ODA is significantly higher than that of 4,4'-ODA, so that Example 1 to Example 3 of the present disclosure are mixed with different ratio of 4,4'-ODA and 3,4'-ODA diamine monomers. The polyimide is synthesized by 4,4'-ODA and 3,4'-ODA diamine monomers with TAHQ dianhydride monomer also has the characteristics of low dielectric constant and low dissipation factor, and adding 4,4'-ODA can greatly reduce the cost.

Figure 4:
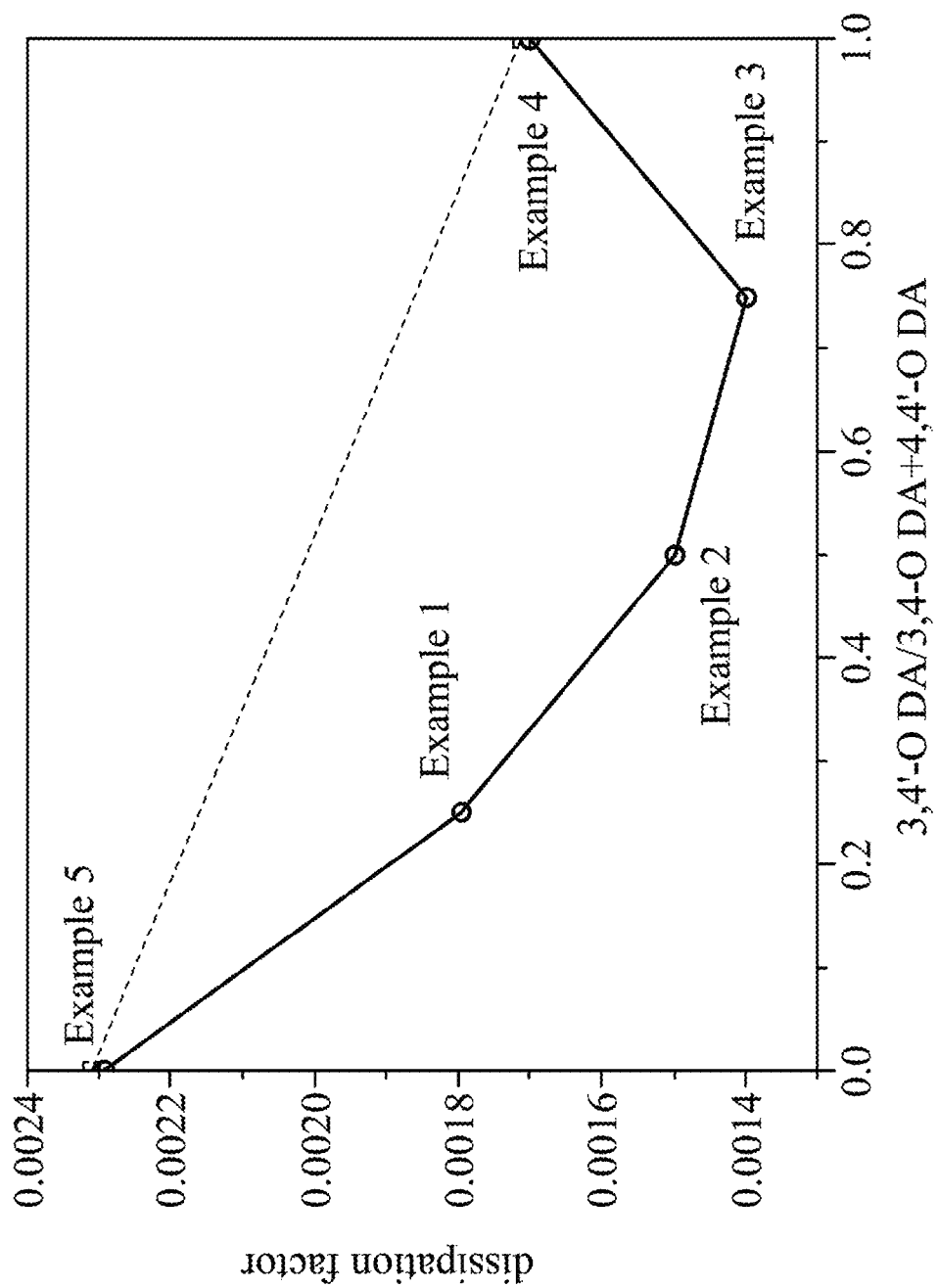
FIG. 4 is a dissipation factor diagram of Example 1 to Example 5.

Please refer to FIG. 4, which is a dissipation factor diagram of Example 1 to Example 5. As known from FIG. 4, it shows the unexpected negative deviation effect, that is, the copolymer shows the lower dissipation factor than the linear combination thereof (the dotted line). That is, introducing 4,4'-ODA to 3,4'-ODA and TAHQ, not only can reduce the cost, but also can reduce the dissipation factor.

In conclusion, the polyimide of the present disclosure synthesized from different ratio of 4,4'-ODA and 3,4'-ODA diamine monomers with TAHQ dianhydride monomer containing the ester group has the characteristics of the low dielectric constant and the low dissipation factor, and it can greatly reduce the cost. Moreover, the prepared flexible copper clad laminate thereof can pass the heat resistant of solder float test, which is favorable to apply the production of 5G high-frequency transmission printed circuit flexible boards to be satisfied with the requirement of the industry.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A low-dissipation flexible copper clad laminate, comprising:
    a copper foil; and
    a polyimide film attached to the copper foil, wherein the polyimide film comprises a polyimide, and the polyimide has a structure represented by formula (I):

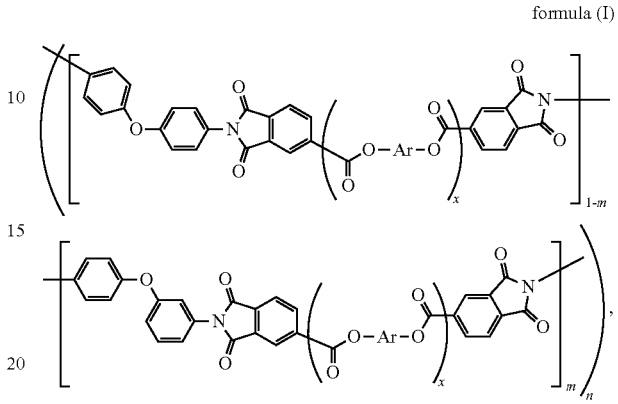

formula (I)

wherein Ar is a divalent organic group containing an aromatic ring, x is 1, n is an average value, and 30≤n≤500, 0.25≤m≤1, but m excludes 0.5 and 1.

2. The low-dissipation flexible copper clad laminate of claim 1, wherein in the formula (I), Ar is a structure represented by formula (A), formula (B) or formula (C):

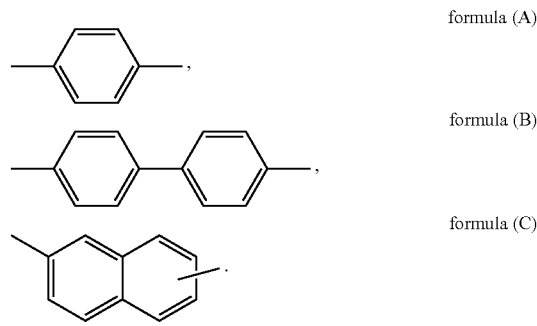

formula (A)

formula (B)

formula (C)

3. The low-dissipation flexible copper clad laminate of claim 2, wherein in the formula (I), when Ar is the structure represented by formula (A), the polyimide contained in the polyimide film has a structure represented by formula (I-A):

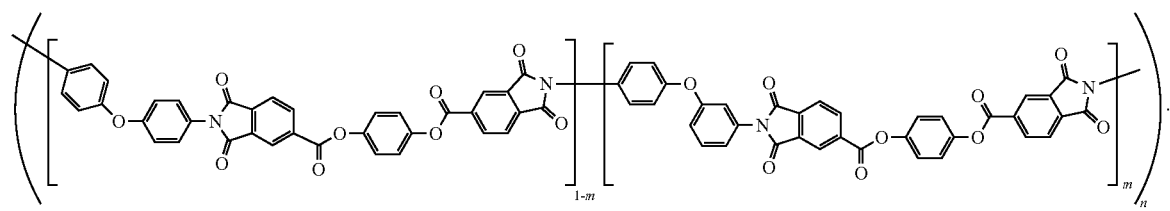

formula (I-A)

4. The low-dissipation flexible copper clad laminate of claim 3, wherein a dielectric constant of the polyimide film is 2.8 to 3.5.

5. The low-dissipation flexible copper clad laminate of claim 3, wherein a dissipation factor of the polyimide film measured at 10 GHz is less than 0.0025.

6. A manufacturing method for a low-dissipation flexible copper clad laminate of claim 1, comprising:

performing a mixing step, wherein a diamine monomer represented by formula (i) and a diamine monomer represented by formula (ii) are dissolved in an organic solvent, and then a dianhydride monomer represented by formula (iii) is added to form a polyamic acid solution:

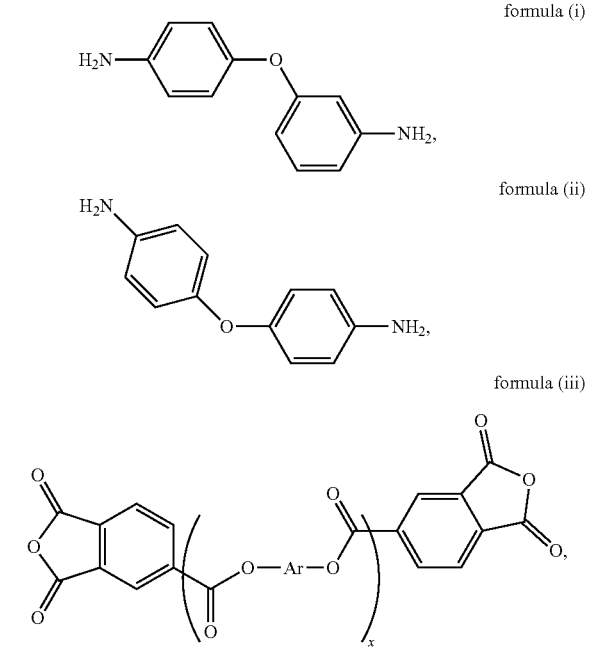

wherein Ar is the divalent organic group containing the aromatic ring, x is 1; and performing a condensation reaction, wherein the polyamic acid solution is coated on the copper foil, and performed a heat and ring-closing to obtain the low-dissipation flexible copper clad laminate.

7. The manufacturing method of claim 6, wherein in the formula (iii), Ar is a structure represented by formula (A), formula (B) or formula (C):

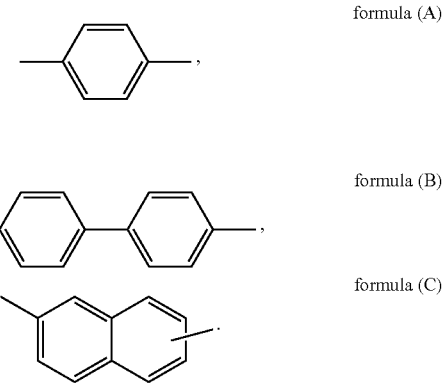

8. The manufacturing method of claim 6, wherein the organic solvent is dimethylacetamide, dimethylformamide, or N-methyl-2-pyrrolidone.

9. The manufacturing method of claim 6, wherein a molar ratio of the diamine monomer represented by formula (i) plus the diamine monomer represented by formula (ii) to the dianhydride monomer represented by formula (iii) is 0.9 to 1.1.

10. An electronic device comprising the low-dissipation flexible copper clad laminate of claim 1.

* * * * *